United States Patent [19]

Marbot

[11] Patent Number: 5,347,538
[45] Date of Patent: Sep. 13, 1994

[54] TRANSCEIVER FOR BIDIRECTIONAL LINK, INTEGRATED CIRCUIT INCLUDING THE TRANSCEIVER, AND APPLICATION TO COMMUNICATION BETWEEN UNITS OF A SYSTEM

[75] Inventor: Roland Marbot, Versailles, France
[73] Assignee: Bull S.A., Paris, France
[21] Appl. No.: 843,210
[22] Filed: Feb. 28, 1992

[30] Foreign Application Priority Data

Mar. 14, 1991 [FR] France .................. 91 03127

[51] Int. Cl.$^5$ .................. H04B 1/38; H04L 5/16
[52] U.S. Cl. .................. 375/7; 375/36; 379/403; 330/307
[58] Field of Search .............. 375/7, 36; 379/402, 379/405, 407, 403; 370/26; 330/252, 253, 254, 257, 278, 288, 307

[56] References Cited

U.S. PATENT DOCUMENTS

| | | | |
|---|---|---|---|
| 3,700,831 | 10/1972 | Aagaard et al. | 379/405 |
| 3,909,559 | 9/1975 | Taylor | 379/405 |
| 4,128,743 | 12/1978 | Huellwegen | 379/402 |
| 4,989,243 | 1/1991 | Choi | 379/402 |
| 5,052,039 | 9/1991 | Moisin | 379/402 |

FOREIGN PATENT DOCUMENTS

| | | |
|---|---|---|
| 0009592 | 4/1980 | European Pat. Off. |
| 0026931 | 4/1981 | European Pat. Off. |
| 0067310 | 12/1982 | European Pat. Off. |
| 0186142 | 7/1986 | European Pat. Off. |
| 0220626 | 5/1987 | European Pat. Off. |
| 2923277 | 12/1980 | Fed. Rep. of Germany |
| 0014505 | 8/1980 | France |
| 502726 | 3/1971 | Switzerland |

OTHER PUBLICATIONS

Patent Abstracts of Japan, vol. 7, No. 280, Dec. 1983.
Patent Abstract of Japan, JP 59 159 406, vol. 9, No. 47, Feb. 27, 1985.

*Primary Examiner*—Curtis Kuntz
*Assistant Examiner*—Don N. Vo
*Attorney, Agent, or Firm*—Kerkam, Stowell, Kondracki & Clarke

[57] ABSTRACT

Transceiver for transmission over serial bi-directional links having a bi-directional amplifier including an impedance (R) for adaptation to the line and connected to it, a generator (G1) commanded for transmission and supplying the adaptation impedance (R) and the line in parallel, detection device (G2, r) for furnishing a measurement signal (V) representative of either the current circulating in the adaptation impedance (R) when the generator (G1) is active, or the sum of the current in the adaptation impedance (R) and a compensation value when the first generator (G1) is not active. The compensation value is determined so as to make the measurement signal (V) independent of the transmission state of the transceiver.

37 Claims, 7 Drawing Sheets

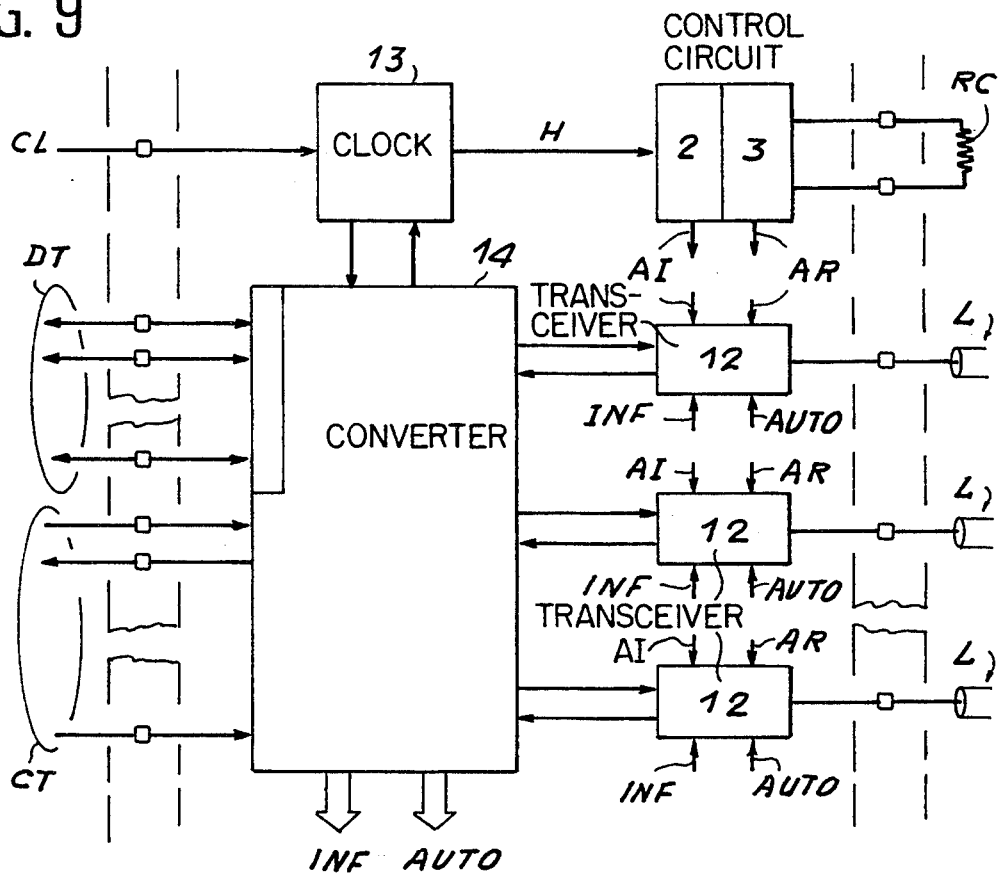
FIG. 9
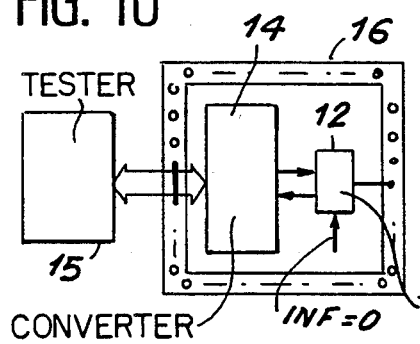
FIG. 10
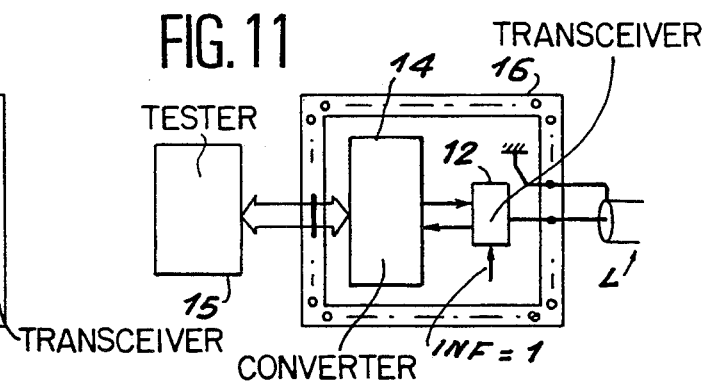
FIG. 11
FIG. 12
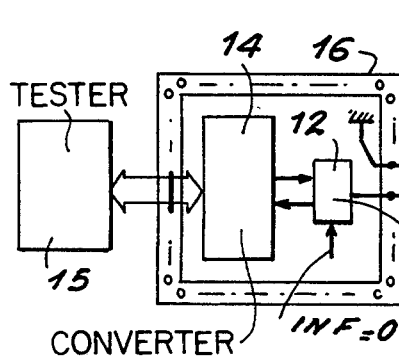
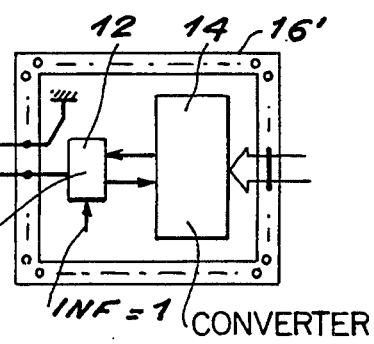

_5,347,538_

TRANSCEIVER FOR BIDIRECTIONAL LINK, INTEGRATED CIRCUIT INCLUDING THE TRANSCEIVER, AND APPLICATION TO COMMUNICATION BETWEEN UNITS OF A SYSTEM

TECHNICAL FIELD OF THE INVENTION

The invention relates to apparatus for digital data transmission between stations or units by way of serial bidirectional links of the point-to-point type. These links include a transmission carrier, such as twisted pairs, coaxial cables or optical fibers, connected at each end to a station by a transmitter and a receiver associated with the station.

BACKGROUND

For numerous applications, it is preferable to use a transmission mode that enables simultaneous operation in both directions between the two points, for the sake of better utilization of the lines.

In particular, this solution is adapted to make the interconnection between the units of a central information process subsystem including a large number of units. Since the current trend is to considerably increase the number of processors and memories, the selection of a bus to effect the exchanges of information between all these units is no longer appropriate. It is preferable in this context to use serial links, connecting each unit to all the other units of the system in such a way as to increase the parallelism. Considering the large number of links required in such a system, the choice of bidirectional links is preferable.

Generally, bidirectional transmission necessitates the presence in each station of a transceiver connected to the lines by an adaptation impedance. In the receiving part, means should also be provided enabling handling collisions, that is, the case where the transmitters of two stations connected to one another transmit simultaneously over the common link. These means must under all circumstances permit the detection of the existence and nature of the signals transmitted by the remote station, from the electrical state of the line.

To solve this problem, the principle of compensation in the receiver for the effect produced on the line by the transmitter of the same station when it is transmitting is typically employed. In the case of transmission, this calls for subtraction of the transmission signal from the signal present on the line. The difference obtained is then representative of the signal transmitted by the transmitter of the remote station. Such a solution is described in European Patent Application EP-A-186142 entitled "Two wire bidirectional digital transmission system".

SUMMARY OF THE INVENTION

The invention proposes another solution, consisting not in subtracting the transmission signal from the line signal when the transmitter of the station in question is transmitting, but contrarily adding the line signal, when the station is not transmitting, to a compensation signal of the same polarity, suitably chosen so that the resultant sum will be representative of the transmission signal of the other station.

More precisely, the subject of the invention is a transceiver, provided to be connected by a transmission link to another similar transceiver, the link including at least one transmission line, the transceiver including amplification means for producing transmission signals over the link in response to transmission command signals and for producing reception signals in response to the transmission signals produced over the link by the other transceiver, the transceiver being characterized in that the amplification means include, for each transmission line, a bidirectional amplifier, including:

a first impedance for adaptation to the line and connected to it;

a first generator, commanded in response to the transmission command signals and supplying the first impedance and the line in parallel;

detection means for furnishing a measurement signal, which is representative of either the current circulating in the adaptation impedance when the first generator is active, or the sum of the current circulating in the adaptation impedance and a compensation value when the first generator is not active, the compensation value being determined in such a manner as to meet a compensation condition according to which the measurement signal depends practically only on the transmission signals produced by the other transceiver.

Multiple embodiments are conceivable for producing a signal representing the sum of two currents. Nevertheless, the invention has the advantage that it enables a choice among particularly simple embodiments, because the circuits for adding two signals of the same polarity can be simpler than those that find differences.

This advantage is especially pronounced if one seeks to operation at very high frequency, because the complexity of the circuits always entails interference, due in particular to the electrical links and to the connections.

The invention also relates to a simple, effective embodiment, where the transceiver is further characterized in that the detection means include a second impedance, a first terminal of which is connected at a common point to the adaptation impedance and the line, the second terminal of which, called the reception signal terminal, is supplied by a second generator which is commanded and is of the same polarity as the first generator; that the first and second generator are commanded in response to the command signals in such a way that the first generator is active while the second generator is not, and vice versa; and that the measurement signal is the voltage present at the reception terminal, the compensation value being the voltage at the terminals of the second impedance, the generators and the second impedance being dimensioned so as to meet the compensation condition.

The aforementioned compensation condition, as will be seen in detail hereinafter, requires a relationship between the impedance values and the currents involved in the bidirectional amplifier. In the case of an embodiment by means of discrete circuits, it would be possible to verify this relationship by means of a simple dimensioning of the components of the bidirectional amplifier. On the other hand, this solution is difficult to apply in the case of an integrated circuit, because of process variations and drifting and characteristics from aging or from temperature variations.

To solve this problem, and in a particular characteristic of the invention, the transceiver is characterized in that the first generator includes a current source that is variable and commanded by first automatic control means, such that the compensation condition is met.

On the other hand, to achieve an integrated transceiver capable of operating at a high rate, for example on the order of 1 Gbit/s, the solution involving using an adaptation impedance external to the integrated circuit entails difficulties due in particular to the parasitic inductances introduced by the connections between the impedance and the terminals of the integrated circuit. This problem can be solved if the adaptation impedance is itself integrated, but then the problems discussed above, due to process variations and drifting of characteristics, recur.

To solve this latter problem, and in another feature of the invention, the transceiver is characterized in that it is part of an integrated circuit, and that the first impedance is variable and is commanded by second automatic control means, such that the first impedance assumes a value equal to that of a calibrated impedance external to the integrated circuit and having the value of the characteristic impedance of the line.

Other characteristics of the transceiver according to the invention will become apparent in the course of the description.

In particular, the invention also relates to a transceiver of the differential type, intended to be connected to a differential link formed by two lines serving to carry complementary voltages, during normal operation, that represent a corresponding binary logical value. This embodiment has the advantages in particular of lessening the noise and of simplifying the receiver, by using self-referenced comparators.

The invention also relates to a transceiver characterized in that, given that the link includes two transmission lines, the amplification means include two channels formed of two bidirectional amplifiers respectively associated with the transmission lines; that the amplifiers are commanded respectively by two differential transmission signals forming the transmission command signals; that one of the differential signals commands the first current generator of the first amplifier and the second current generator of the second amplifier, the other of the differential signals commands the first generator of the second amplifier and the second generator of the first amplifier; and that the reception signals are a function of the differential voltage present between the reception terminals of the two bidirectional amplifiers.

The invention also relates to an integrated circuit incorporating a plurality of transceivers having the characteristics discussed above. In that case, some elements, such as the automatic control means, may be common to a plurality of transceivers of the same integrated circuit.

Finally, the invention relates to an information processing system, in which the interconnection among the functional units of this system is achieved by means of integrated circuits according to the invention and respectively associated with the units of this system.

Further aspects, details of embodiment and advantages of the transceiver according to the invention will also be explained in the following drawings and ensuing description taken in conjunction with the drawings wherein like reference characters refer to like parts throughout the several views.

BRIEF DESCRIPTION OF THE DRAWINGS

FIG. 9 shows a parallel-serial, serial-parallel interface circuit that uses the transceiver of the invention.

FIGS. 10, 11 and 12 illustrate the test methods applicable to the transceivers and integrated circuits of the invention.

FIG. 1 is a simplified functional representation of the bidirectional amplifier used in the transceiver.

DESCRIPTION OF THE PREFERRED EMBODIMENTS

Figure 1:
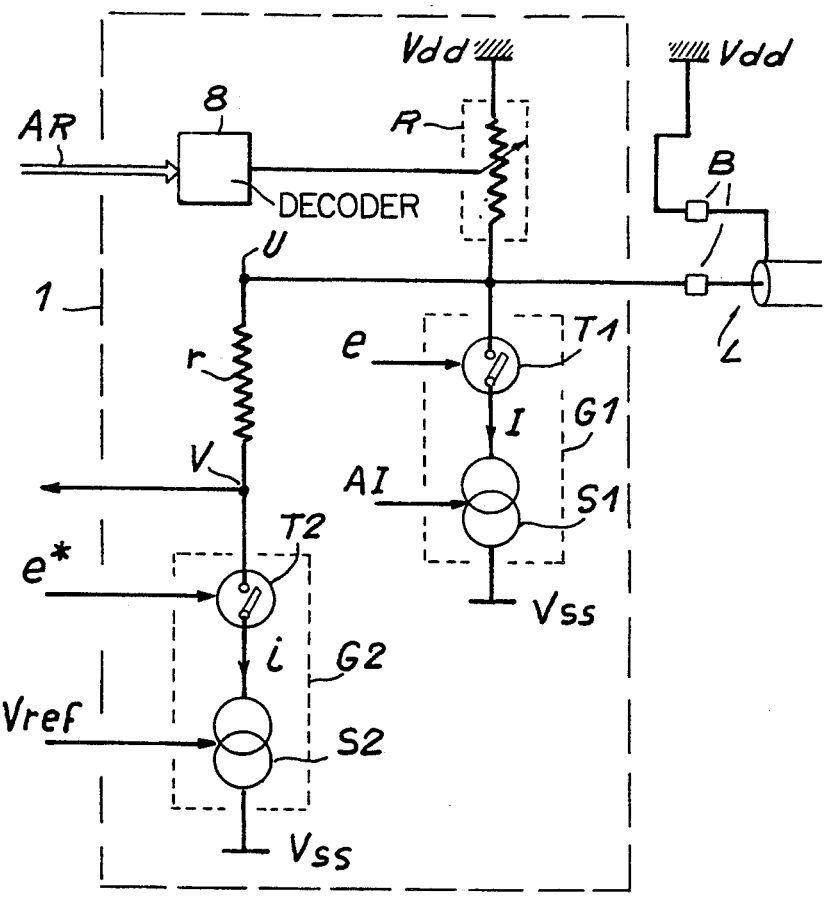
FIG. 1 shows a bidirectional amplifier used in the transceiver according to the present invention.

Referring to FIG. 1, a bi-directional amplifier 1 includes an adaptation impedance R, connected to a transmission line L via terminals B, and a first current generator G1 controlled by a transmission control signal e. The generator G1 is connected in parallel with an assembly including a second impedance r, which is connected in series with a second current generator G2 having the same polarity as the generator G1 and controlled by the signal e* that is the complement of e. Terminal V of the impedance r is connected to the current generator G2 and constitutes the reception terminal, the voltage of which is representative of the signal transmitted by another station connected to the other end of the line L. The other terminal U of the impedance r is connected to the common point of the impedance R, the generator G1 and the line L. The other terminal of the impedance R is connected to a fixed potential Vdd that may be the ground of the circuit. In the case where the transmission line is a coaxial cable, as shown, the cable sheathing is connected to Vdd.

The first current generator G1 is constituted by a first current source S1 furnishing a current I the intensity of which is variable as a function of a variation signal AI. The current source S1 is connected to the impedance R by way of an electronic switch T1 controlled by the signal e.

Similarly, the second generator G2 includes a second current source S2 furnishing a current i varied as a function of a reference voltage Vref and connected to the impedance r by way of a second electronic switch T2 controlled by the signal e*.

The current sources S1, S2 are supplied with a second fixed potential Vss that is negative with respect to ground. The impedance R is assumed to be variable as a function of variation signals AR applied to a decoder 8.

To simplify the explanation of the principle of operation of the bidirectional amplifier 1, it will be assumed at the outset that the line L is loss-free, that i is negligible with respect to I, and that the value of the impedance R is very small compared with that of r. On the other hand, it is assumed that a bidirectional amplifier constituted in the same way is connected to the other end of the line L as a remote station. Finally, it is assumed that the transmission state of a station is expressed by the assumption of a logical 1 on the part of the transmission control signal e, which in that case causes the closure of the electronic switch T1 and the opening of the electronic switch T2.

In operation, four situations may arise:

a) the station in question is the only one transmitting. The generator G2 is then inactive, while the generator G1 furnishes a current I to the impedance R in parallel with the characteristic impedance of the line L. Since the impedance R is assumed to be adapted to the line, a current I/2 circulates in this impedance, and the voltage at the terminal U as well as at the terminal $V_T$ is accordingly equal to RI/2.

b) if no station is transmitting, the generator G1 of each station is inactive and the generators G2 are active. The voltage V at the terminal $V_T$ is then practically equal to −ri.

c) if the two stations are transmitting, the generators G2 are inactive, and the current I produced by the first generator G1 of the station and that of the remote station are superimposed in the impedances R and in the line. Assuming linear operation, the voltage at the terminal U and at the terminal $V_T$ will then equal −RI.

d) if the remote station is the only one transmitting, a current I/2 circulates in the impedance R, and the voltage at the terminal U equals −RI/2. On the other hand the current i circulates in the impedance r and the Voltage V at the terminal $V_T$ is accordingly equal to −rI−−RI/2.

Since the object is to obtain a signal that is dependent only on the transmission state of the remote station, it can be confirmed that if the values of the impedances r and R and currents i and I are selected such that the ratio is −ri=RI/2, then the voltage V at the reception terminal $V_T$ indeed confirms this condition. This voltage will then be equal to −RI when the remote station is transmitting, and −RI/2 when it is not transmitting.

However, it should be noted that the relationship ri=RI/2 makes it possible to obtain voltage levels at the terminal $V_T$ that are strictly independent of the transmission state of the station, on the condition that the initial hypotheses are perfectly verified. If not, the voltage at the reception terminal $V_T$ would depend on the transmission state, but the resultant imperfect compensation could, under certain circumstances, still enable detection of transmission by the remote station, by comparing the reception voltage to well-selected threshold values.

A more precise calculation would make it possible to establish a relationship among R, I, r, i in order to perform compensation exactly under real conditions. This relationship should express the condition that the drop in voltage in the serial impedances R and r observed when the transmitter in question is the only one to transmit is equal to that observed when no transmitter is transmitting. This condition is strictly a linear function, and it remains valid without any necessity of making hypotheses as to the order of magnitude of the resistance r or current i, or of the characteristic impedance of the line.

Thus, assuming an ideal operation of the current generators, the compensation condition is expressed by the relationship: RI/2=(R/2+r)i.

The compensation condition could be met by means of a suitable dimensioning of the resistances and current sources of the transceiver. However, from the perspective of an integrated embodiment, means would have to be provided enabling automatic variation of the characteristics of the components and circuits, so as to compensate for the process variations and drift in characteristics.

Figure 2:
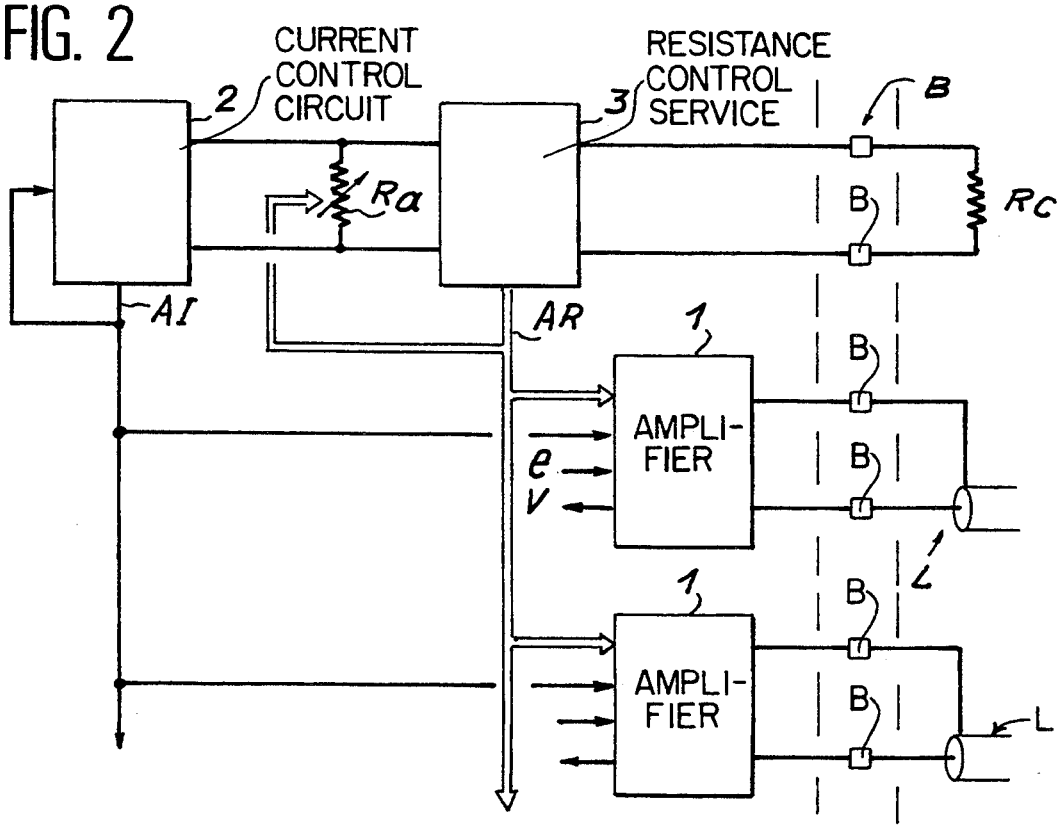
FIG. 2 shows automatic control means associated with the bidirectional amplifier.

To this end, automatic control means are provided, schematically shown in FIG. 2. FIG. 2 represents an integrated circuit that includes a plurality of transceivers, of which only the bidirectional amplifiers 1 are shown. Each amplifier 1 is connected to an associated line L by way of the pads B of the integrated circuit. The circuit includes means for automatic control of the currents I and adaptation resistances R of the amplifier 1. The automatic control of current I is effected by means of a current control circuit 2 connected to an automatic control impedance Ra, the constitution and dimensioning of which is a function of the impedance R. The circuit 2 furnishes a current variation signal AI applied to the variation input of the current sources S1 of the amplifiers 1. The current control circuit 2 is designed so as to adjust the current I of the current sources to verify the compensation condition mentioned above. A detailed description of the current control circuit 2 will be given in conjunction with FIG. 4.

The means for automatic control of the impedances R include a resistance control circuit 3 connected to the automatic control impedance Ra and to a calibrated impedance Rc external to the integrated resistance control circuit. The circuit 3 furnishes a signal AR for variation of the automatic control impedance Ra and the impedances R of the amplifiers. The circuit 3 automatically controls the value of the resistance Ra and R to the value of the calibrated resistance Rc equal to the characteristic impedance of the lines L. The resistance control circuit 3 will be described in detail in conjunction with FIG. 6.

The means for automatic control of the intensity I and of the impedances R assure that the compensation condition will be verified, regardless of process variations and drift characteristics, while maintaining the adaptation condition of the adaptation impedances.

Figure 3:
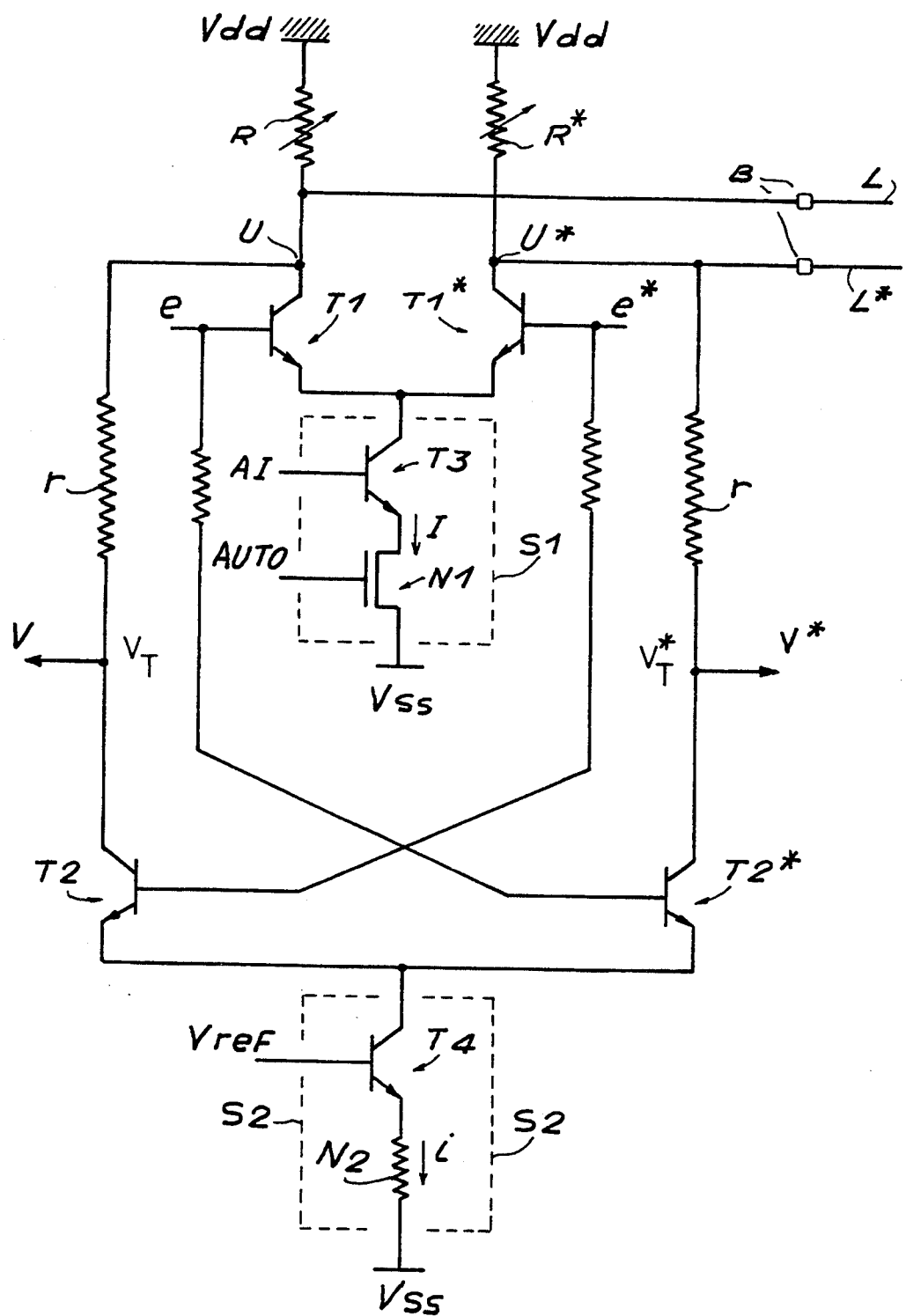
FIG. 3 shows a bidirectional amplifier of the differential type.

FIG. 3 shows a BiCMOS embodiment of a bidirectional amplifier of the differential type. Functionally, it is equivalent to two bidirectional amplifiers of FIG. 1, disposed symmetrically and respectively joined to the lines L, L* of a differential link. Since in the differential mode only one of the paths is active at a given time, it suffices to provide a single current source S1, S2 that is common to the current generators G1, G2 associated with the two paths.

Thus the left-hand channel associated with line L includes an adaptation impedance R connected via the point U to the line L and to the collector of a bipolar transistor T1, the emitter of which is connected to the first common current source S1. The base of the transistor T1 receives the transmission control signal e. The collector of the transistor T1 is connected to the collector of a second transistor T2 by way of the impedance r. The emitter of the transistor T2 is connected to the second common current source S2. Symmetrically, the right-hand path connected to the second line L* of the differential link includes an adaptation impedance R* connected via the point U* to the collector of a transistor Ti*, the emitter of which is connected to the common current source S1. The collector of the transistor T1*, is connected to the collector of the transistor T2* by way of the impedance *r. The emitter of the transistor T2* is connected to the second common current source S2. The transistor T1*, receives the signal e*, which is the complement of the signal e, at its base. The signals e and e* constitute differential transmission control signals. These signals are complementary and they represent a predetermined logic value. The signals e and e* are applied respectively to the base of the transistors T2* and T2, by way of resistors serving to compensate for the time constant due to the structural capacity of the impedances R*.

The current source S1 is constituted by a bipolar transistor T3, the collector of which is connected to the emitters of the transistors T1 and Ti*, and the emitter of which is connected to the negative potential Vss by way of the drain-to-source path of an NMOS transistor N1. The base of the transistor T3 is controlled by the variation signal AI, and the gate of the transistor N1 receives a supply control signal AUTO. Similarly, the second current source S2 is constituted by a bipolar transistor T4, the collector of which is connected to the emitters of the transistors T2 and T2*, and the emitter of which is connected to the voltage Vss by way of a resistor N2.

The operation of the circuit of FIG. 3 can easily be understood from that of FIG. 1, with the help of the following comments. For each channel, the first current generator G1 is constituted by the transistor T1 or T1* acting as a switch, and by the first common current source S1. Similarly, the second current generator G2 is embodied by the transistor T2 or T2* and the second current source S2. Each channel thus functions exactly like the circuit of FIG. 1, but taking into account the differential operating mode, only one of the transmission control signals e, e, is active at a given time, which is true both for the transceiver of the station in question and for that of the remote station. As a result, because of the aforementioned compensation, the voltages V and V* present at the measurement terminals $V_T$ and $V_T$* will respectively assume the values $-RI$ and $-RI/2$ or $-RI/2$ and $-RI$, depending on whether the left-hand or right-hand channel of the transmitter of the remote station is active or not. Accordingly the voltages V and V* constitute a differential signal as a function of the differential transmission signal of the remote station and can be used downstream of the amplifier, after suitable shaping.

Figure 4:
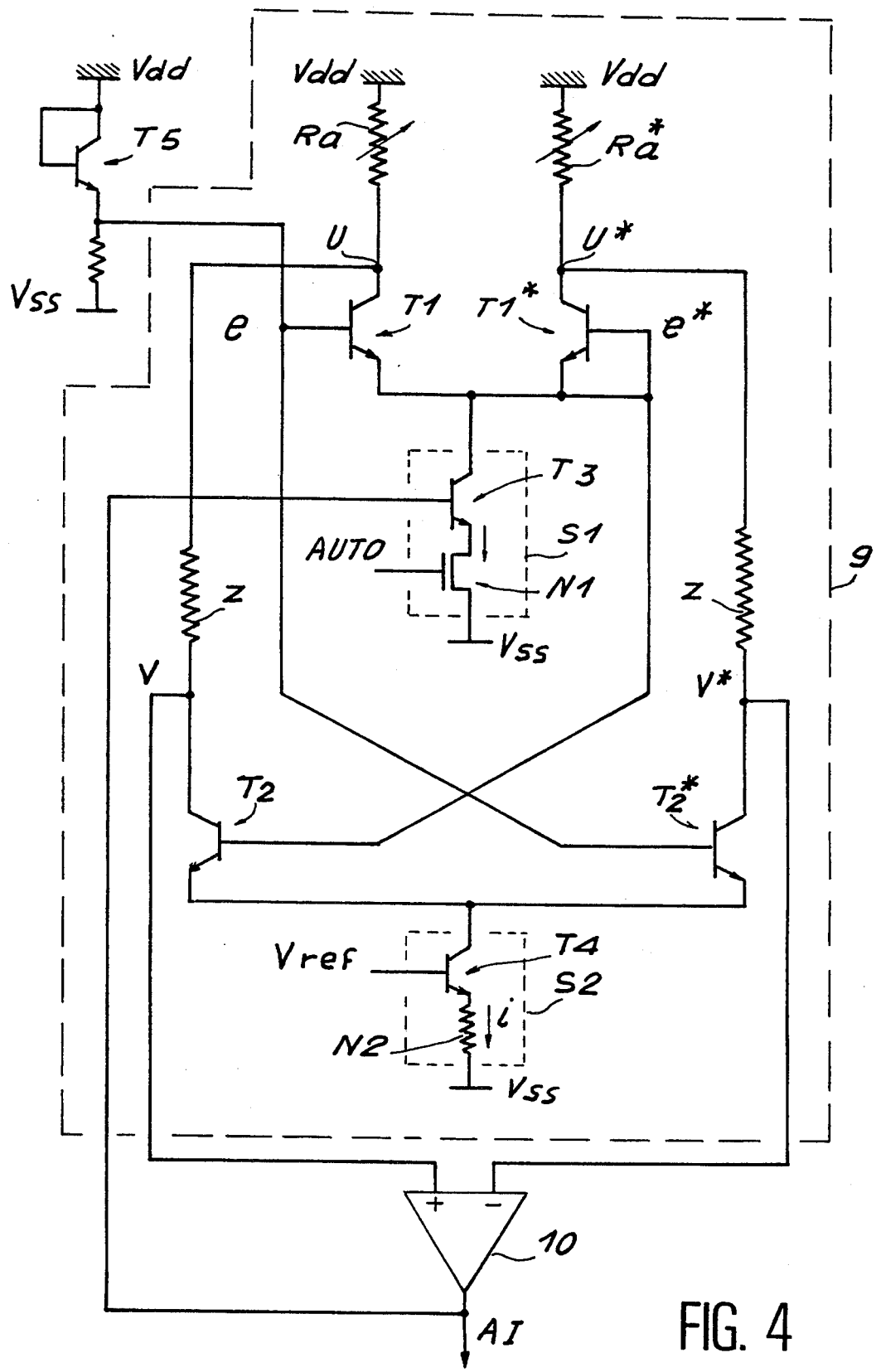
FIG. 4 shows an embodiment of the first automatic control means.

FIG. 4 shows a current control circuit 2 that is especially suitable for controlling the differential amplifier of FIG. 3. It has been seen that the compensation condition requires that the voltage drop between the serial resistors R and r must be the same, when the transmitter in question is the only one transmitting and when no transmitter is transmitting. Consequently, the circuit of FIG. 4 is designed so as to simulate both these cases, to compare the corresponding measurement voltages, and to adjust the current I in such a way as to obtain the equality of these voltages.

To that end, the circuit of FIG. 4 includes an automatic control circuit 9 of substantially the same constitution and size as the differential amplifier of FIG. 3, but modified in such a way as to attain the simulations sought over both its channels. In particular, a fixed differential transmission control signal is applied to the bases of the transistors T1, T1* in such a way as to make them conducting and nonconducting, respectively. For this purpose, the emitter of the transistor T1* is connected to its base, while the base of the transistor T1 receives a voltage that is positive relative to Vss. This voltage is furnished by an assembly including a bipolar transistor T5, the base and collector of which are connected to ground and the emitter of which is connected to the potential Vss by a suitable resistor. The emitter of the transistor T5 furnishes the basic voltage of the transistor T1.

On the other hand, the adaptation impedance R and the second impedance r are replaced respectively by an automatic control impedance Ra, Ra* and an impedance z. The selection of the values for Ra, Ra* and z must take into account the fact that unlike the circuit 9, the transceiver has its adaptation impedances R connected to the lines, and consequently the current source S1 furnishes an equivalent impedance that is equal to one-half the adaptation impedance. Thus in a first possibility, the automatic control impedances Ra, Ra* could be embodied by placing two impedances identical to the adaptation impedances R used in the transceiver parallel to one another. In that case, the impedance z would be identical to r.

In another possibility, automatic control impedances Ra, Ra* identical to the adaptation impedance R are used, selecting a value for z equal to twice that of the second impedance r. The impedance r would then be embodied by parallel connecting two impedances that are identical to z. This solution simplifies the embodiment of the control impedances Ra, Ra*, which like the adaptation impedances R are preferably variable. In addition, this solution makes it possible to use the impedance Ra of the left-hand channel to achieve the automatic control of the impedances R, as will be seen hereinafter.

In still another possibility, the impedances R and Ra, on the one hand, and r and z on the other have the same value, but the current furnished by the current source S1 of the automatic control circuit 9 is half that furnished by the source S1 of the bidirectional amplifier. To achieve this, it suffices to dimension the transistor N1 of the circuit 9 so that it will have a resistance twice that of the amplifier. In the event that R is not negligible with respect to r, then it would be suitable for the value of the impedance Ra* to be equal to R/2.

In all cases, and always assuming a linear function, the voltages V and V* are proportional to the voltage drops at the terminals of the impedances R and r of the transmitter, respectively, when it is the only one transmitting and when no transmitter is transmitting. The voltages V and V* are applied to the direct input and the inverting input, respectively, of a differential amplifier 10 with high gain and a high input impedance, the output of which furnishes the current variation signal AI, which is then applied to the base of the transistor T3 of the current source S1 of the control circuit 9 and bidirectional amplifier 1.

In a variant embodiment, the amplifier 10 could be replaced with a digital assembly similar to that used for automatic control of impedances, as will be seen in detail hereinafter.

It is apparent that the circuit of FIG. 4 varies the current I of the current sources S1 in such a way as to permanently maintain the compensation condition sought.

Since the control circuit 9 has substantially the same constitution and size as the bidirectional amplifiers 1, it reproduces their behavior with good precision, independently of process variations, and takes into account any possible not-insignificant stray currents of the switching transistors T1, Ti*, T2, T2*.

Naturally, this circuit assures that the compensation condition will be strictly verified from the static point of view, which is generally sufficient, because the characteristic impedance of the line, in other words the impedances R and r, are, for high frequencies, practically pure resistors. One skilled in the art could certainly adapt this embodiment so as better to take into account the actual characteristics of the line in each particular case.

In an important feature of the embodiment of the bidirectional amplifier and control circuit, these latter elements include an identical current source S2, embodied by the transistor T4 in series with a resistor N2. As a result, the voltage Vref applied to the base of the transistor T4 defines the voltage drop in the resistor N2 and consequently the current i passing through it. Thus taking into account the condition in terms of dimensioning imposed by the automatic control circuit, the choice of the voltage Vref will indirectly determine the product R.I, which must be fixed with precision, since it fixes the signal dynamics.

In the context of an application to a parallel-serial, serial-parallel interface circuit for interconnecting a large number of units, it is important to provide for the possibility of cutting the power supply to power circuits of the inactive transmitters and receivers. This is why the current sources S1 are provided with an NMOS transistor N1 controlled by a signal AUTO for connection to power. This arrangement has the advantage of reducing the power consumption of the interface circuit, especially in the case of an integrated embodiment.

However, this possibility should be taken into account when designing the receiving part of the transceiver. In effect, if the transceiver of the remote station is in the condition of repose, that is, if its current source S1 is inactive, none of the differential lines will be supplied with power via this transceiver. As a result, no differential voltage V, V* would appear at the output of the bidirectional amplifier, which could cause an erroneous detection of reception signals. To avert this problem, a set of means is provided to address this situation in the receiving portion of the transceiver.

Figure 5:
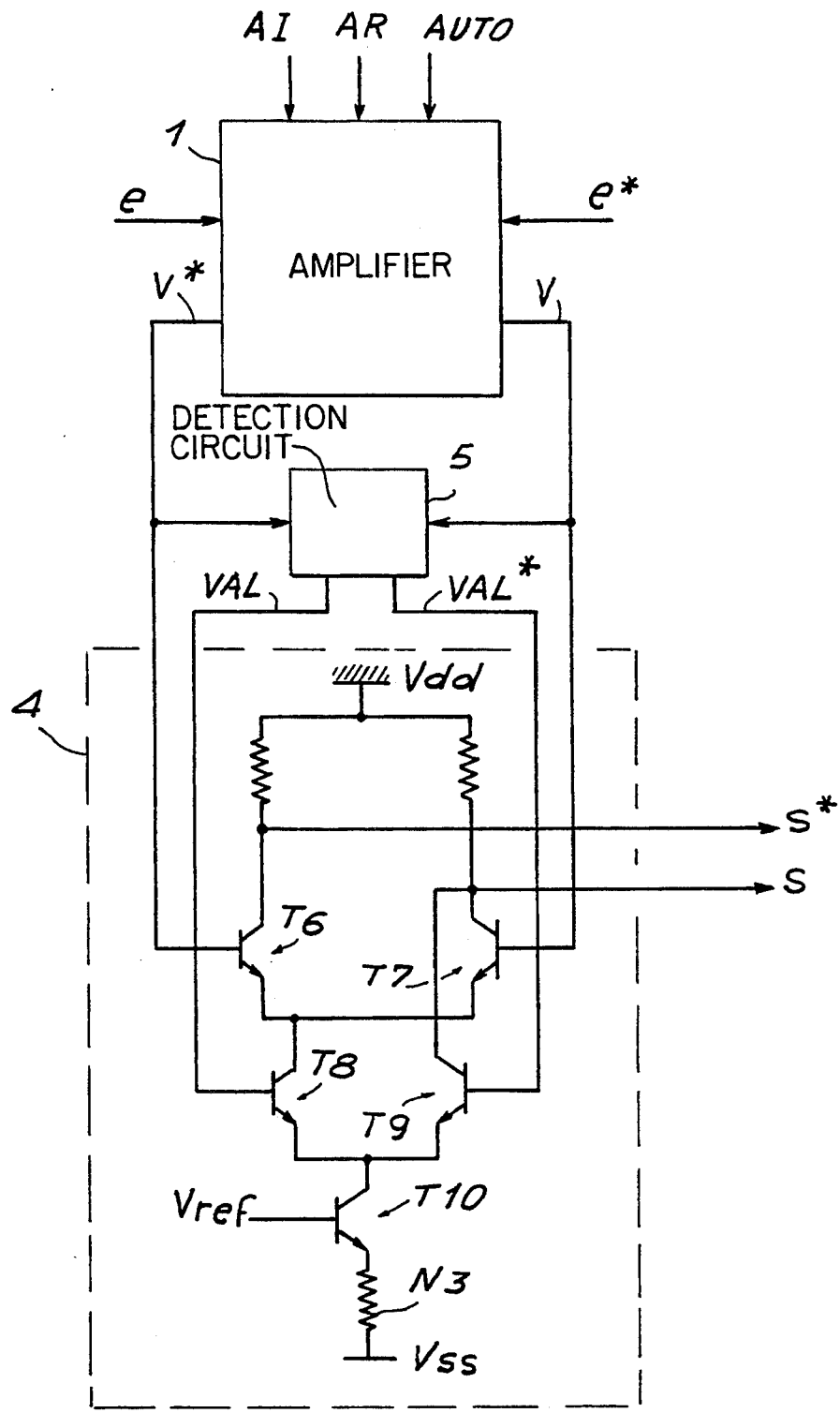
FIG. 5 shows the receiving part of the amplification means of the transceiver of the invention.

FIG. 5 shows the receiving part in its entirety. The bidirectional amplifier 1 can clearly be seen, which is associated with a shaping circuit 4 and a line activity detection circuit 5. The circuit 5 receives the voltages V, V* of the amplifier 1 and furnishes a differential signal VAL, VAL* that results from the comparison between the differential voltage V, V* and a predetermined threshold value. The circuit 5 is in fact constituted by a set of comparators for respectively comparing the voltages V and V* to a threshold value that is between the maximum and minimum voltages that can be assumed by V and V* when the remote station is active. If one of the voltages V or V* is higher than this threshold in absolute value, a logic circuit puts the outputs VAL and VAL* of the circuit 5 at a high and low level, respectively. In the opposite case, the signals VAL and VAL* are respectively put at low and high levels. The embodiment of the circuit 5 is within the competence of one skilled in the art and so it will not be described in further detail here.

The signal shaping circuit 4 is an AND gate made by emitter coupled logic (ECL), composed of two transistors T6, T7 connected to one another by their emitter, and the collectors of which are each connected to ground Vdd by way of a resistors. Two other transistors T8, T9 have their emitters commonly connected to the collector of a fifth transistor T10, the emitter of which is connected to the voltage VSS by way of a resistor N3. The collector of the transistor T8 is connected to the emitters of the transistors T6 and T7, while the collector of the transistor T9 is connected to the collector of the transistor T7. The base of the transistor T10 receives the reference voltage Vref in such a way as to fix the current circulating in the resistor N3. The bases of the transistors T6 and T7 receive the voltages V* and V, respectively. The bases of the transistors T8 and T9 receive the line activity signals VAL and VAL*, respectively. The voltages s* and s at the collectors of the transistors T6 and T7 constitute the differential reception signals that can be used downstream in the remainder of the circuit.

The circuit of FIG. 5 functions as follows. If the remote station is active, a differential voltage V, V* exists, which is detected by the circuit 5, which then furnishes a positive differential signal VAL, VAL*. As a result, the transistor T8 is conducting and the transistor T9 is blocked. The circuit 4 thus functions as a differential amplifier, producing a differential signal at its outputs s, s* that is a function of the differential voltage V, V*.

Contrarily, if the circuit 5 detects the inactivity of the remote station, then the signals VAL and VAL* assume the complementary values of the preceding case. The transistor T8 is then blocked and the transistor T9 is conducting. As a result, the signal s is in the low state, and the signal s* is in the high state, thus forcing the differential output of the shaping circuit to the value of logical 0.

The above description shows the importance of fixing the value of the product RI with enough precision, so as to permit proper operation of the comparators of the detection circuit 5.

Figure 6:
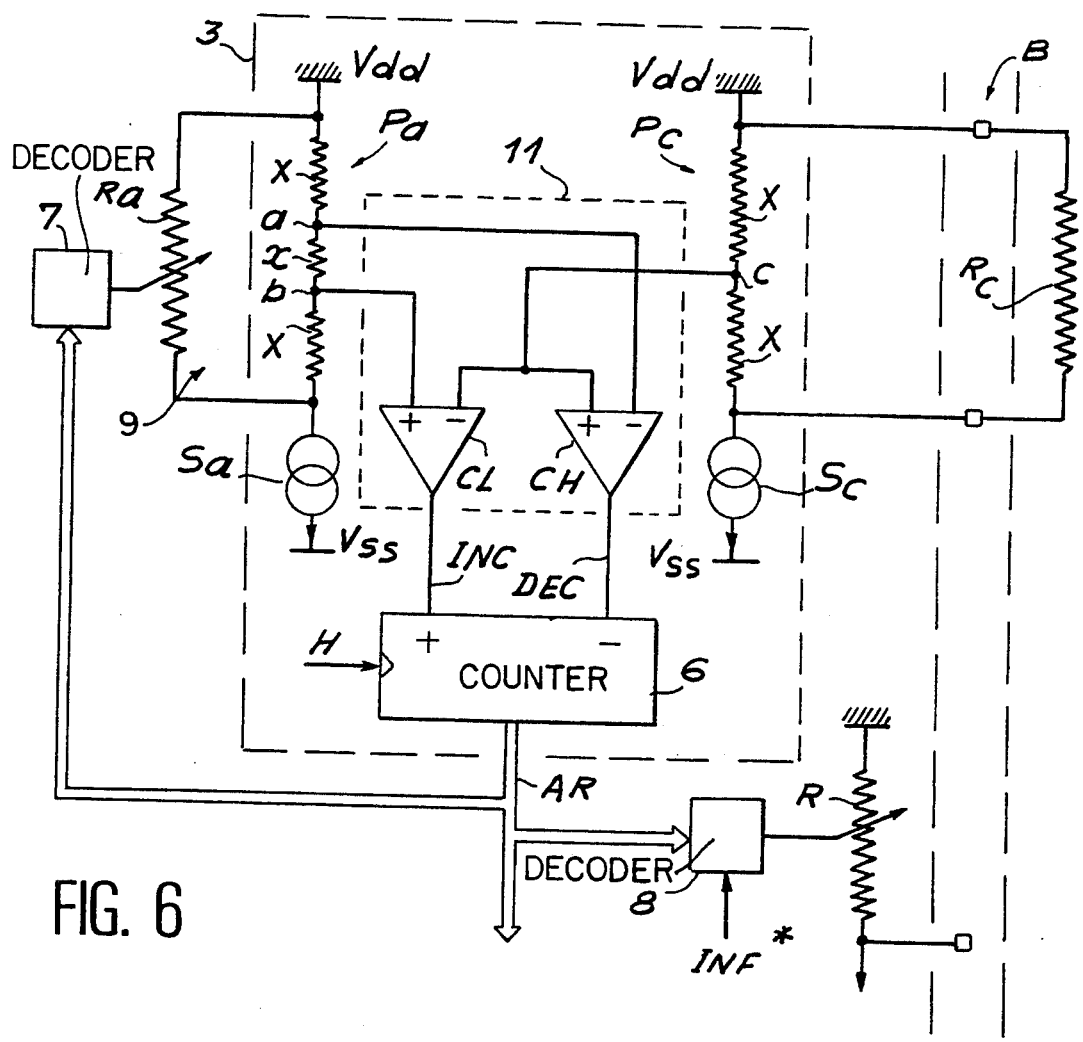
FIG. 6 shows means for automatic control of the variable impedance.

FIG. 6 shows the means for automatic control of the adaptation impedances R. They include an impedance comparator 3 connected to a reference impedance Rc and an automatic control impedance Ra. The reference impedance Rc is a calibrated impedance external to the integrated circuit, and the impedance Ra is an integrated variable impedance having the same constitution and size as the adaptation impedances R to be varied.

The impedance comparator 3 furnishes a digital variation signal AR connected to the decoders 7, 8 associated with the impedance Ra and with each adaptation impedance R, respectively. Each decoder 7, 8 controls the value of the associated impedance. The decoders 8 associated with the adaptation impedances R are distinguished associated with the decoder 7 from the impedance Ra by the presence of an additional input INF* provided for the test operations, which will be explained hereinafter.

As in the case of automatic control of the current, the above-described embodiment makes it possible to adjust the purely resistive part of the adaptation impedances. One skilled in the art could modify this embodiment to take into account the actual characteristics of the line, if necessary.

The impedance comparator 3 includes two voltage divider bridges Pa, Pc connected in parallel with Ra and Rc, respectively. These two parallel assemblies are supplied by the identical current sources Sa and Sc, respectively. In the case where the impedance Ra is the one used in the circuit 9 for automatic control of the currents, the source Sa is in fact the source S1 of the circuit 9. The comparator 3 also includes a voltage comparator 11 connected to the divider bridges Pa and Pc and an up-down counter 6. The voltage comparator 11 is in fact constituted by two comparators CL, CH, which respectively furnish an incrementation signal INC applied to the upward counting input of the up-down counter 6 and a decrementation signal DEC applied to its downward counting input. The middle point c of the divider bridge, having resistance $2X$, is connected to the inverting input of the comparator CL and to the direct input of the comparator CH. The divider bridge Pa includes two intermediate terminals a, b, such that the resistance X between the point a and ground and the resistance between the point b and the current Sa will be equal, while a resistance x between points a and b is equal to a fraction of X. The point a is connected to the inverting input of the comparator CH, and the point b is connected to the direct input of the comparator CL. This arrangement, by a suitable dimensioning of X and x, makes it possible to produce a hysteresis effect such that the incrementation or decrementation signals INC or DEC will be active when the value of the control impedance Ra is respectively less than or greater than the value of the reference impedance Rc having a predetermined threshold value. This has the advantage of avoiding instability in the variation of the adaptation impedances.

This threshold value will be defined by a percentage of error imposed and bearing on the value of Rc. On the other hand, it can be confirmed that the operation of the comparator 3 is practically independent of process variations, to the extent that X is sufficiently high with respect to Rc, which is always possible.

Thus the state of the up-down counter 6 is representative of the variation value to be applied to the impedances R and Ra so that their value will be equal to the value of the reference impedance Rc, with a small error percentage.

The automatic control of FIG. 6 is accordingly of the digital control type. It would have been possible to imagine an analog version, for instance using PMOS transistors, resistors with drain-to-source paths constituting the variable impedances R and Ra, the gates being controlled by an analog variation signal representative of the difference between the value of the calibrated impedance Rc and that of the control impedance Ra. However, that solution has the disadvantage that the analog variation signal is exposed to alteration during its transmission through the circuit, in particular in the case of an integrated circuit that includes a large number of transceivers.

The digital embodiment of FIG. 6 accordingly solves this problem. The use, suggested above, of PMOS transistors as variable impedances will be possible if they were associated with digital/analog conversion circuits. However, that version would necessitate using bulky transistors, the structural capacity of which could interfere with operation at very high frequency.

A completely digital version is accordingly preferable. To achieve this, each variable impedance is embodied by means of a plurality of resistors connected selectively in parallel via a digital variation signal. It can be noted that the case of the impedance Ra is slightly different from that of the impedances R, because it is unnecessary to provide the possibility for Ra to assume an infinite value for the test operations. Consequently, one of the resistors Ra could be permanently connected.

Figure 7:
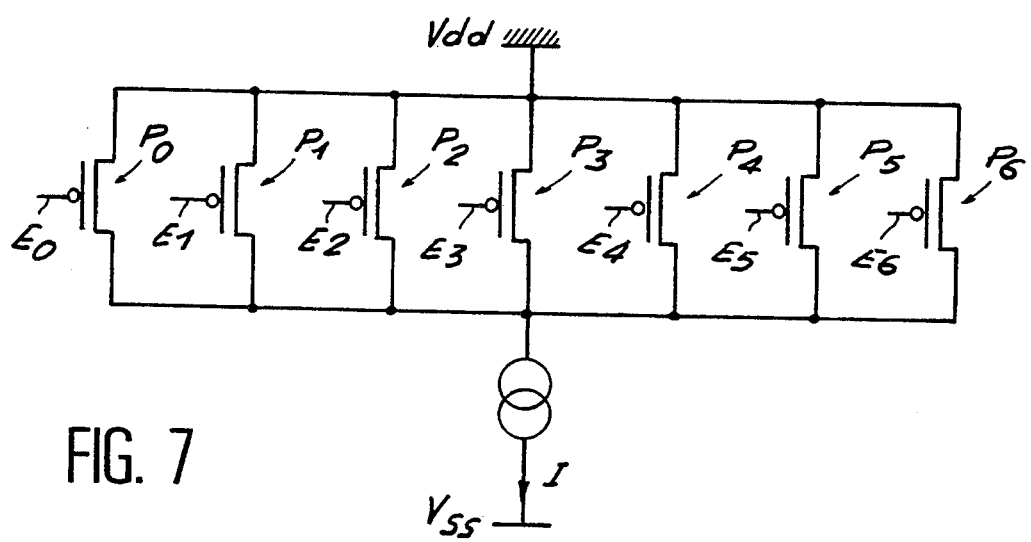
FIG. 7 shows an embodiment of a variable adaptation impedance.

FIG. 7 shows an embodiment of this kind, where each resistor is constituted by a PMOS transistor P0–P6. The transistors are connected in parallel, with their sources connected to ground and their drains connected to the associated current source. The gates of the transistors P0–P6 are controlled by the signals E0–E6, respectively. The resistance of the drain-to-source path of each transistor then assumes a value that depends on the dimensioning of the transistor (its gate width, for example) and on the manufacturing process, with a margin of uncertainty around a typical value corresponding to the most probable case.

It is conceivable to select a dimensioning of the resistors P0–P6 so as to achieve weighting of a binary code (the resistors are all different and are proportional to a power of 2), but this version presents the problem of simultaneous switching of a plurality of resistors, which could cause interference at the line level.

To avoid this problem, it is preferable to use resistors dimensioned so that their successive activations lead to regularly decreasing values of the equivalent resultant resistance. On the other hand, for a given precision, this brings about an increase in the number of resistors and hence in the number of control signals. Thus to compensate for this disadvantage, the solution chosen consists in using an encoded digital variation signal as the variation signal AR and associating a corresponding decoder 7, 8 with each impedance to be varied. The code used is advantageously a Gray code, furnished directly by the up-down counter 6. A detailed embodiment of this up-down counter and of the associated decoders is shown in FIG. 8.

Figure 8:
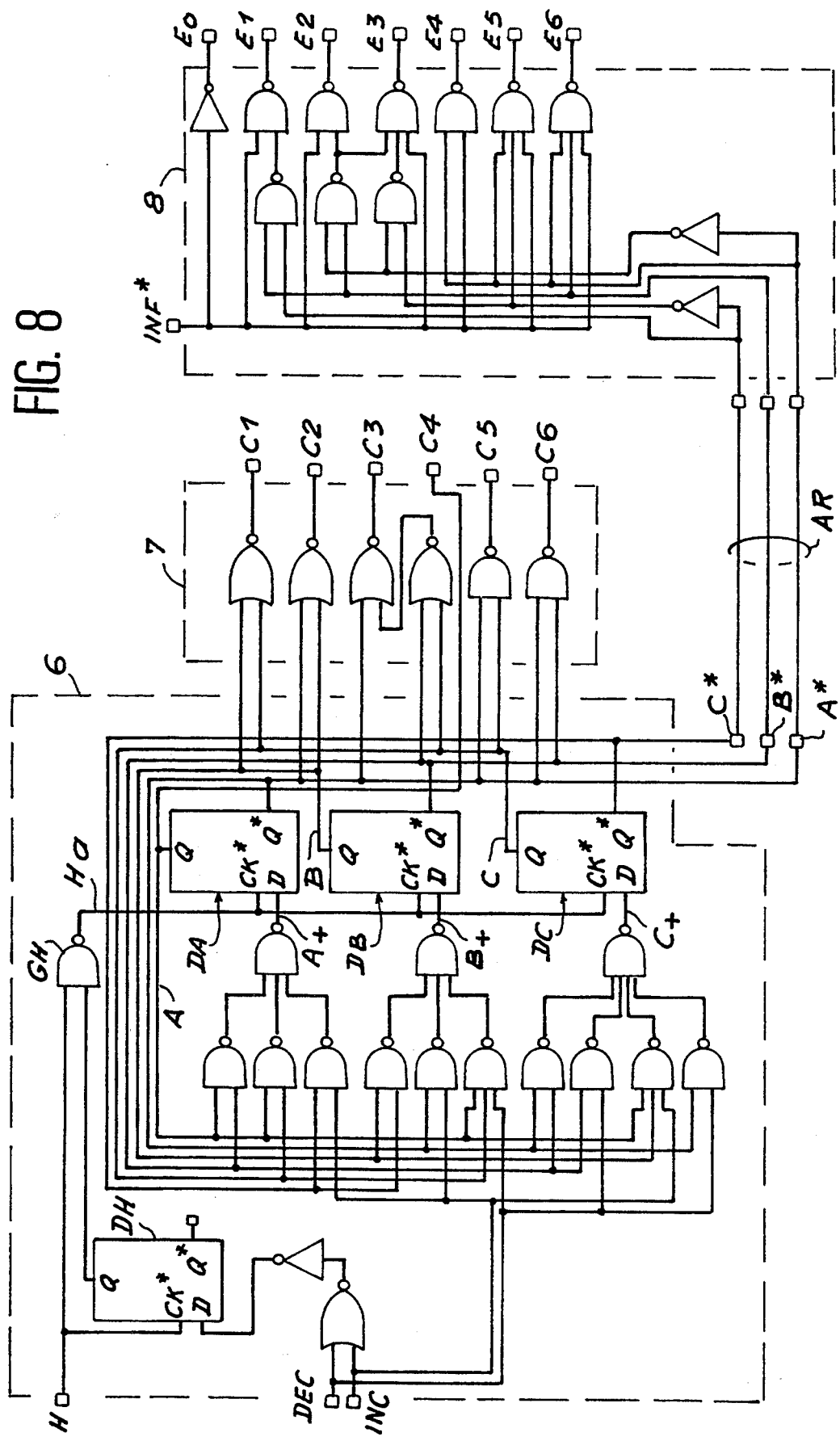
FIG. 8 shows circuits with which the automatic control of the variable impedance can be made.

Before FIG. 8 is described, it is suitable to give a detailed exemplary embodiment of the above circuits.

Since the characteristic impedance of the line is 50 $\Omega$, an error of less than 5% for the adaptation impedances will be imposed, for example, given the limits of variation of approximately 25% in the values of the components.

The adaptation impedances must then be capable of varying regularly between approximately 37 and 63 $\Omega$, in the typical case. The calculations and simulations then lead to a solution with seven transistors P0–P6 with increasing resistances, the sizes of which are easy to calculate as a function of the technology employed.

On the other hand, the incrementation or decrementation signals INC or DEC must be active when the impedance Ra is respectively less than or greater than the impedance Rc by 5%. The calculations then show, where Rc=50 $\Omega$, that one can assume the following values: X=500 $\Omega$ and x=50 $\Omega$. Assuming R.I=0.5 V, an immunity to noise for a noise level of less than 3.3 mV results.

FIG. 8 shows the up-down counter 6 and the decoders 7 and 8 in the particular case where the adaptation impedances include seven parallel PMOS transistors.

The decoder 7 associated with Ra has only six outputs, C1–C6, connected to the gates of the transistors P1–P6, respectively. The transistor P0 is made conducting permanently by a negative polarization of its gate. When one output C1–C6 of the decoder 7 assumes the value of logical 0, the transistor P1–P6 that it controls is made conducting.

The decoder 8 includes 7 outputs E0–E6, and operates similarly to the decoder 7, except for the difference that the first transistors P0 may be conducting or blocked depending on whether the output E0 is at 0 or 1.

The up-down counter 6 includes three multivibrators Da, Db, Dc of the D type defining the counter state. At their inputs D, the multivibrators Da, Db, Dc receive the logic signals $A_+$, $B_+$, $C_+$, respectively, furnished by a set of logic gates as a function of the signals INC and DEC and the states A, B, C of the multivibrators Da, Db, Dc.

This logic circuit performs the following equations:

$$A_+ = [(A \cdot B^*)^* \cdot (A \cdot C)^* \cdot (C^* \cdot INC)^*]^* \quad (1)$$

$$B_+ = [(B \cdot C^*)^* \cdot (A^* \cdot INC)^* \cdot (A \cdot C \cdot DEC)^*]^* \quad (2)$$

$$C_+ = [(A^* \cdot B^*)^* \cdot (A^* \cdot DEC)^* \cdot (B^* \cdot DEC)^* \cdot (A \cdot B \cdot INC)^*]^* \quad (3)$$

where the asterisk symbol indicates the operation of complementation.

Because of this control logic, the counter can assume seven different states, with the state 000 being prohibited. Each state A, B, C corresponds to the value, encoded in the Gray code, of the number of transistors that have to be in the conducting state. As a result of this arrangement, any modification imposed upon the value of the impedances to be varied translates into the change in state of a single one of the multivibrators Da, Db, Dv at a given time.

To improve the security of operation of the up-down counter, the multivibrators are synchronized by the trailing edges of a clock signal Ho as a function of a primary signal H and of the state of an additional multivibrator DH. At its inverse clock input CK*, the multivibrator DH receives the clock signal H, and at its input D it receives the logical sum DEC+INC. The clock signal H and the noninverting output Q of the multivibrator DH are connected to the inputs of a NAND gate GH that furnishes the signal Ho to the inverted inverse clock input CK* of the multivibrators Da, Db, Dc.

The up-down counter 6 functions as follows. When the difference in absolute value between the values of Ra and Rc is less than the threshold, then the signals DEC and INC remain at 0. When a trailing edge at the clock signal H arrives, the multivibrator DH is set to 0, and the output Ho of the gate GH is held at 1, which prevents any change in state of the multivibrators Da, Db, Dc. Contrarily, if the difference between Ra and Rc exceeds the threshold, then one of the signals DEC or INC is at 1, and the input D of the multivibrator DH receives the value of logical 1. Upon the appearance of the next trailing edge of a clock signal, the state of the multivibrator DH returns to 1, and the output of the gate GH furnishes a complementary signal to the clock signal H. The output of the gate GH is then at 1 but returns to 0 upon the appearance of the next leading edge of H, and the multivibrator Da, Db, Dc are updated again in accordance with the above equations (1), (2) and (3).

The operation that has just been described above shows that the up-down counter is activated only when a modification must be made, and this makes it possible to simplify the logic circuit for controlling the multivibrators. Additionally, because of the multivibrator DH and the gate GH, the multivibrators Da, Db, Dc are perfectly synchronized by the clock signal H, without the risk that the appearance of signals INC or DEC will cause interference.

The decoders 7 and 8 receive the state signals A, B, C of the multivibrators Da, Db, Dc, or their complement, and at the output furnishes the signals C1–C6 or E0–E6 that control the associated variable impedances.

The outputs C1–C6 of the decoder 7 verify the following equations:

$$CL = (C+B)^*$$

$$C2 = (A^* + B)^*$$

$$C3 = [A^* + (B^* + C)^*]^*$$

$$C4 = A$$

$$C5 = (A^* \cdot C)^*$$

$$C6 = (A^* \cdot B^*)^* \quad (4)$$

The decoder 8 is provided so as to be capable of controlling its impedance at the infinite value when the test signal INF is at 1. On the other hand, to limit the number of lines Connecting the up-down counter 6 to the various decoders 8 of the integrated circuit, only the signals A*, B*, C* originating in the inverting outputs of the multivibrators Da, Db, Dc are applied to the input of the decoder 8. Taking these constraints into account, the decoder 8 is designed so as to perform the following logical equations:

$$E0 = INF$$

$$E1 = (B^* \cdot C^* \cdot INF^*)^*$$

$$E2 = (A \cdot B^* \cdot INF^*)^*$$

$$E3 = (A \cdot B^*)^* \cdot (A \cdot B)^* \cdot INF^*$$

$$E4 = (A^* \cdot INF^*)^*$$

$$E5 = (A^* \cdot C \cdot INF^*)^*$$

$$E6 = (A^* \cdot B^* \cdot INF^*)^* \quad (5)$$

FIG. 9 shows a parallel-serial, serial-parallel interface circuit in which the invention can advantageously be applied. This circuit is assumed to be embodied as an integrated circuit provided so as to be connected on the one hand to parallel input-output lines composed of data lines DT and control lines CT, and serial transmission lines L, on the other.

This circuit includes serialization-deserialization means 14 connected to the parallel input-outputs DT, CT and to the various transceivers 12 by the associated serial transmission and reception lines. Each transceiver 12 is connected to a bidirectional transmission line L by way of an amplifier 1 in accordance with the above description. Each line L connects the associated transceiver to another transceiver belonging to a remote station.

The integrated circuit also includes means 2, 3 for automatic control of the current I and of the adaptation impedances R of the amplifiers. Finally, a clock generator 13 receiving a master clock signal CL furnished by an external clock drives the serialization-deserialization means 14. In transmission, the generator 13 functions as a frequency multiplier so as to adapt the serial data transmission rate to the parallel data reception rate. In reception, the generator 13 effects the regeneration of a clock signal at the frequency of the serial data based on these data and performs a frequency division to control the parallel portion of the serializer-deserializer.

The circuits 13 and 14 are the subject of one exemplary embodiment described in detail in each of the following French Patent Applications, filed on Jul. 11, 1990: "Procédé et système de transmission numérique de données en série" ["Method and Digital Transmission System for Serial Data"], No. 90.08811; "Dispositif de sérialisation et de désérialisation de données et système de transmission numérique de données en série en résultant" ["Arrangement for Serialization and Deserialization of Data, and Resultant Digital Transmission System for Serial Data"], No. 90.08812; "Dispositif de'échantillonage de données et systéme de transmission numérique de données en résultant" ["Arrangement for Data Sampling and Resultant Digital Data Transmission System"], No. 90.08813.

The circuit 14 further includes means for selecting the transceivers and furnishing them with the signals INF and AUTO with a view to respectively performing the test operations and the cutoff of a power supply to the amplifiers associated with the inactive lines.

The operation of the circuit of FIG. 9 is to a large extent conventional and accordingly does not require detailed explanation. For further details, reference is made to the above identified patent applications.

It is appropriate, however, to specify that the serialization-deserialization means 14 include circuits for monitoring the activity of the transceivers as a function of commands CT that indicate the destination station. Conversely, these circuits are provided so as to furnish monitoring signals at the parallel interface in response to the identity of the active reception lines. On the other hand, decoding circuits may be provided, furnishing the signals INF and AUTO to the transceivers designated by the appropriate command CT. The practical embodiment of these circuits will depend essentially on the parallel interface selected.

For example, if the command CT include an address portion and a monitoring portion, the address portion will serve as an input to address decoders. Test control signals and power supply control signals for the monitoring portion will be used to validate one of the signals INF or AUTO selected by the address decoder.

FIGS. 10, 11 and 12 symbolically show the test operations that can be performed on the integrated circuit of FIG. 9. In these drawing figures, the serializer-deserializer 14 of the integrated circuit 16 is connected by its parallel input-outputs to a test apparatus 15. As before, the circuit 14 is connected to the transceivers 12, only one of which is shown, for the sake of simplicity.

In a first possibility, shown in FIG. 10, the integrated circuit 16 is tested after production, before being connected to the serial transmission lines. In that case, the tester 15 causes the signal INF of the transceiver to be tested to be set to 0, which causes its current source to supply the adaptation impedances in their normal configuration. Next, the tester 15 commands this transceiver to transmit a set of data applied to the parallel inputs of the circuit 14. The circuit 14 converts them into serial data and transmits them to the transceiver 12 selected. As a function of the serial data received, the amplifier 1 of the transceiver 12 receives transmission control signals, which consequently activate the current sources that supply power to the adaptation impedances.

Since the line is not connected, the source S1 supplies only the adaptation impedance R of the active channel, hence outputting at an impedance twice the equivalent impedance that it supplies when the transceiver is in the normal operating state. Consequently, the voltage V or V* of the active channel assumes the value−RI. On the other hand, the voltage V* or V of the inactive channel assumes the value −(R+r) i, or in other words practically −RI/2.

The voltages V and V* that appear at the reception terminals of the amplifier 1 accordingly reproduce the transmission control signals, which after shaping and conversion into parallel data are received by the test apparatus 15. The latter then performs the comparison between the parallel data transmitted initially and the data received. If they match, this signifies that the circuits 13, 14 and 12 have functioned properly.

The same operation is then performed by successively selecting the other transceivers of the circuit.

Thus because of the particular design of the transceivers, the operations of testing the integrated circuit are quite simple and make it possible to verify not only the proper function of the transceivers but also of all the appended and intermediate circuits, such as the serializer-deserializer 14.

Tests can also be performed while the integrated circuit is in place in a system, with its transceivers connected to the transmission lines L.

In a first possibility illustrated in FIG. 11, the test apparatus 15 causes the signal INF of the transceiver to be tested to be set to 1, which forces its adaptation impedances to the infinite value. The current source of its amplifier 1 supplies the only transmission lines L. Since the adaptation impedances have a value equal to the characteristic impedance of the lines, the situation is the same as in FIG. 10, and the test can be performed in the same manner.

In that case, the test provides an additional indication as to the integrity of the connections between the transceiver and the terminals of the integrated circuit and the connections between the terminals and the lines.

It can be noted that the above two tests simulate the normal operation accurately in the case of transmission without current loss.

In other possibility shown in FIG. 12, the transceivers of two integrated circuits 16, 16' are connected to one another by the lines L, and the test apparatus commands the setting to 0 of the signal INF of the transceiver of the integrated circuit 16 to be tested and the setting to 1 of the signal INF of the corresponding transceiver of the other integrated circuit 16'.

In that case, the transceiver 12 of the circuit 16 is in its normal configuration, while that of the circuit 16' has its adaptation impedances disconnected.

Thus the line L is open at its end that is connected to the circuit 16', and consequently the signals output by the circuit 16 are sent over the line to the circuit 16' and reflected there and then retransmitted over the line to the circuit 16. As a result, the reflection of the signals simulates a transmission from the signal 16' and a transmission over a line twice as long as the actual line, with the possibility of collision among the signals transmitted and the signals received.

The test can then be performed as before, but it furnishes an additional indication as to the integrity of the line and of the connections between the line and the transceiver of the remote station. In addition, this test takes into account the possible current losses in the course of transmission. Finally, the reflection effect can be exploited to locate line defects by analysis of the reception signals and the delay between transmission and reception of the test signals.

It is important to note that the last two test possibilities can advantageously be combined for locating defects. Thus, if the test of FIG. 12 reveals a defect, the test of FIG. 11 will indicate whether or not the defect is due to the circuit 16.

In the context of a parallel-serial, serial-parallel interface circuit, the test methods above are particularly advantageous in the case of a high-speed link, because only low frequency signals are exchanged between the test apparatus and the integrated circuit to be tested.

In a variant embodiment of the circuit, test circuits controlled from outside have been included, which are capable of automatically generating parallel test signals, effecting comparisons, and memorizing the results of these comparisons in registers that are accessible from outside.

This test circuit would include a test signal generator, for example a random signal generator, controlled by an activation circuit that would be programmed to trigger the sending of a predetermined number of test words. Since the reception clock signal is regenerated on the basis of the serial signals received, it is independent of the transmission clock signal. The comparison circuits must also be designed to take into account the phase displacements between the signals transmitted and the signals received. This can be done by means of buffer memories. However, a less bulky embodiment consists in associated with the comparison circuit a test signal generator identical to that for transmission, programmed in the same way and synchronized by the reception clock signal. This embodiment makes it possible to omit both the buffer memories and the resynchronization circuits that would otherwise be necessary.

The fact that test circuits are provided inside the integrated circuit has the double advantage of not requiring an external test apparatus and of enabling even better exhaustiveness of the tests. In fact, using a test apparatus would considerable slow down the test operations, because of the desynchronization between transmission and reception, which involves numerous operations of writing and reading in the memory of the test apparatus.

The embodiment of the test signal generators, the comparison means and the memorization means is within the competence of one skilled in the art and accordingly does not require further detailed description.

I claim:

1. A transceiver adapted to be connected by a transmission link to a similar second transceiver, said link including at least one transmission line (L, L*), said transceiver including amplification means for producing transmission signals over said link in response to transmission command signals (e, e*) and for producing reception signals (s, s*) in response to transmission signals produced over said link by said second transceiver, wherein said amplification means include, for each transmission line (L, L*), a bi-directional amplifier (1), including:

a first adaptation impedance means (R) for adaptation to the transmission line and being connected to said transmission line;

a first generator (G1) having an active and an inactive state and commanded in response to said transmission command signals (e, e*) for supplying current to said first impedance means (R) and said transmission line in parallel; and detection means (G2, r) operatively connected to said first adaptation impedance means (R) for furnishing a measurement signal (V), which is representative of either a current circulating in the adaptation impedance means (R) when said first generator (G1) is active, or a sum of the current circulating in the adaptation impedance means (R) and a compensation value when said first generator (G1) is not active, said compensation value being determined so as to meet a compensation condition according to which said measurement signal (V) depends on the transmission signals produced by the other transceiver.

2. The transceiver of claim 1, wherein said detection means include a second impedance means (r), having a first terminal connected at a common point (U) to the adaptation impedance means and the transmission line and a second reception signal terminal (V$_T$), means connecting said reception signal terminal to a second generator (G2) which is commanded and is of the same polarity as said first generator (G1); said first and said second generators (G1, G2) being commanded in response to said command signals (e, e*) such that the first generator (G1) is active while the second generator (G2) is not, and vice versa; and said measurement signal is the voltage present at said reception signal terminal (VT), said compensation value being the voltage at the terminals of said second impedance means (r), said generators means (G1, G2) and said second impedance means (r) being constructed and arranged to meet said compensation condition.

3. The transceiver of claim 2, wherein said first generator (G1) includes a variable current source (S1) commanded by first automatic control means (2), such that said compensation condition is met.

4. The transceiver of claim 1, wherein said transceiver is part of an integrated circuit, and the first impedance means (R) is a variable impedance and is commanded by second automatic control means (3), and further wherein said first impedance means (R) assumes a value equal to that of a calibrated impedance (Rc) external to the integrated circuit and having a value substantially equal to a characteristic impedance of the transmission line.

5. The transceiver of claim 2, wherein said transceiver is part of an integrated circuit, and the first impedance means (R) is a variable impedance and is commanded by second automatic control means (3), and further wherein said first impedance means (R) assumes a value substantially equal to that of a calibrated impedance (Rc) external to the integrated circuit and having a value substantially equal to a characteristic impedance of the transmission line.

6. The transceiver of claim 4, wherein on the command of a test signal (INF), said first impedance means (R) is switched to a high-impedance state.

7. The transceiver of claim 5, wherein on the command of a test signal (INF), said first impedance means (R) is switched to a high-impedance state.

8. The transceiver of claim 4, wherein said first variable impedance means (R) comprises field-effect transistors (P0–P6), the drain-to-source paths of which are connected in parallel and are made selectively conductive by said second automatic control means (3).

9. The transceiver of claim 5, wherein said first variable impedance means (R) comprises field-effect transistors (P0–P6), the drain-to-source paths of which are connected in parallel and are made selectively conductive by said second automatic control means (3).

10. The transceiver of claim 6, wherein said first variable impedance means (R) comprises field-effect transistors (P0–P6), the drain-to-source paths of which are connected in parallel and are made selectively conductive by said second automatic control means (3).

11. The transceiver of claim 7, wherein said first variable impedance means (R) comprises field-effect transistors (P0-P6), the drain-to-source paths of which are connected in parallel and are made selectively conductive by said second automatic control means (3).

12. The transceiver of claim 3 further including a bipolar transistor T3 having a collector, an emitter and a base, wherein the current (I) of said current source (S1) is furnished by the collector of the bipolar transistor (T3), the emitter of which is connected to a second potential (Vss) by way of a resistor (N1), and that said first automatic control means (2) control a base voltage applied to the base of said bipolar transistor (3).

13. The transceiver of claim 4 further including a bipolar transistor T3 having a collector, an emitter and a base, wherein the current (I) of said current source (S1) is furnished by the collector of the bipolar transistor (T3), the emitter of which is connected to a second potential (Vss) by way of a resistor (N1), and that said first automatic control means (2) control a base voltage applied to the base of said bipolar transistor (3).

14. The transceiver of claim 6 further including a bipolar transistor T3 having a collector, an emitter and a base, wherein the current (I) of said current source (S1) is furnished by the collector of the bipolar transistor (T3), the emitter of which is connected to a second potential (Vss) by way of a resistor (N1), and that said first automatic control means (2) control a base voltage applied to the base of said bipolar transistor (3).

15. The transceiver of claim 8 further including a bipolar transistor T3 having a collector, an emitter and a base, wherein the current (I) of said current source (S1) is furnished by the collector of the bipolar transistor (T3), the emitter of which is connected to a second potential (Vss) by way of a resistor (N1), and that said first automatic control means (2) control a base voltage applied to the base of said bipolar transistor (3).

16. The transceiver of claim 12, wherein said resistor (N1) is constituted by a drain-to-source path of a field effect transistor, having a gate which is polarized by a signal (AUTO) for turning on said amplification means.

17. The transceiver of claim 13, wherein said resistor (N1) is constituted by the drain-to-source path of a field effect transistor, having a gate which is polarized by a signal (AUTO) for turning on said amplification means.

18. The transceiver of claim 14, wherein said resistor (N1) is constituted by the drain-to-source path of a field effect transistor, having a gate which is polarized by a signal (AUTO) for turning on said amplification means.

19. The transceiver of claim 15, wherein said resistor (N1) is constituted by the drain-to-source path of a field effect transistor, having a gate which is polarized by a signal (AUTO) for turning on said amplification means.

20. The transceiver of claim 2, wherein said link includes two transmission lines (L, L*), said amplification means include two signal paths formed by two bi-directional amplifiers respectively associated with said transmission lines; said amplifiers being commanded respectively by two differential transmission signals (e, e*) forming said transmission command signals; and further wherein one of the differential signals (e) commands the first generator (G1) of the first amplifier and the second generator (G2*) of the second amplifier, the other of said differential signals (e*) commands the first generator (G1*) of the second amplifier and the second generator (G2) of the first amplifier; and said reception signals (s, s*) are a function of the differential voltage (V, V*) present between the reception terminals of the two bi-directional amplifiers.

21. The transceiver of claim 3, wherein said link includes two transmission lines (L, L*), said amplification means include two signal paths formed by two bi-directional amplifiers respectively associated with said transmission lines; said amplifiers being commanded respectively by two differential transmission signals (e, e*) forming said transmission command signals; and further wherein one of the differential signals (e) commands the first generator (G1) of the first amplifier and the second generator (G2*) of the second amplifier, the other of said differential signals (e*) commands the first generator (G1*) of the second amplifier and the second generator (G2) of the first amplifier; and said reception signals (s, s*) are a function of the differential voltage (V, V*) present between the reception terminals of the two bi-directional amplifiers.

22. The transceiver of claim 4, wherein said link includes two transmission lines (L, L*), said amplification means include two signal paths formed by two bi-directional amplifiers respectively associated with said transmission lines; said amplifiers being commanded respectively by two differential transmission signals (e, e*) forming said transmission command signals; and further wherein one of the differential signals (e) commands the first generator (G1) of the first amplifier and the second generator (G2*) of the second amplifier, the other of said differential signals (e*) commands the first generator (G1*) of the second amplifier and the second generator (G2) of the first amplifier; and said reception signals (s, s*) are a function of the differential voltage (V, V*) present between the reception terminals of the two bi-directional amplifiers.

23. The transceiver of claim 6, wherein said link includes two transmission lines (L, L*), said amplification means include two signal paths formed by two bi-directional amplifiers respectively associated with said transmission lines; said amplifiers being commanded respectively by two differential transmission signals (e, e*) forming said transmission command signals; and further wherein one of the differential signals (e) commands the first generator (G1) of the first amplifier and the second generator (G2*) of the second amplifier, the other of said differential signals (e*) commands the first generator (G1*) of the second amplifier and the second generator (G2) of the first amplifier; and said reception signals (s, s*) are a function of the differential voltage (V, V*) present between the reception terminals of the two bi-directional amplifiers.

24. The transceiver of claim 8, wherein said link includes two transmission lines (L, L*), said amplification means include two signal paths formed by two bi-directional amplifiers respectively associated with said transmission lines; said amplifiers being commanded respectively by two differential transmission signals (e, e*) forming said transmission command signals; and further wherein one of the differential signals (e) commands the first generator (G1) of the first amplifier and the second generator (G2*) of the second amplifier, the other of said differential signals (e*) commands the first generator (G1*) of the second amplifier and the second generator (G2) of the first amplifier; and said reception signals (s, s*) are a function of the differential voltage (V, V*) present between the reception terminals of the two bi-directional amplifiers.

25. The transceiver of claim 12, wherein said link includes two transmission lines (L, L*), said amplification means include two signal paths formed by two bi-directional amplifiers respectively associated with said transmission lines; said amplifiers being commanded respectively by two differential transmission signals (e, e*) forming said transmission command signals; and further wherein one of the differential signals (e) commands the first generator (G1) of the first amplifier and the second generator (G2*) of the second amplifier, the other of said differential signals (e*) commands the first generator (G1*) of the second amplifier and the second generator (G2) of the first amplifier; and said reception signals (s, s*) are a function of the differential voltage (V, V*) present between the reception terminals of the two bi-directional amplifiers.

26. The transceiver of claim 16, wherein said link includes two transmission lines (L, L*), said amplification means include two signal paths formed by two bi-directional amplifiers respectively associated with said transmission lines; said amplifiers being commanded respectively by two differential transmission signals (e, e*) forming said transmission command signals; and further wherein one of the differential signals (e) commands the first generator (G1) of the first amplifier and the second generator (G2*) of the second amplifier, the other of said differential signals (e*) commands the first generator (G1*) of the second amplifier and the second generator (G2) of the first amplifier; and said reception signals (s, s*) are a function of the differential voltage (V, V*) present between the reception terminals of the two bi-directional amplifiers.

27. The transceiver of claim 20, wherein said first generators (G1, G1*) are current generators and include a first common current source (S1); each first current generator (G1, G1*) including a first switch (T1, T1*) connecting said first common current source (S1) to said first terminal (U) of the second impedance (r); said first switches (T1, T1*) being commanded respectively by said differential transmission signals (e, e*).

28. The transceiver of claim 27, wherein said second generators (G2, G2*) are current generators and include a common current source (S2); each of said second current generators including a second switch (T2, T2*) connecting said second common current source (S2) to said reception terminal (V); the second switch (T2, T2*), which is associated with a transmission line (L, L*), being commanded by the differential transmission signal (e*, e) that commands the first switch (T1, T1*) associated with the other transmission line (L, L*).

29. The transceiver of claim 28, wherein said first common current source (S1) is variable and is commanded by the first automatic control means (2), which include an automatic control circuit (9) of the same constitution as said amplification means, dimensioned and polarized so as to simulate a transmission over one signal path and the absence of a transmission over the other signal path; and that said first automatic control means (2) further include a voltage comparator (10), the inputs of which are respectively connected to the reception terminals (V, V*) of the amplifier of said automatic control circuit, and the output of which commands the first current sources (S1) of said automatic control circuit (9) and of said amplifiers (1).

30. The transceiver of claim 21, wherein said first and second switches (T1, T1*; T2, T2*) are bipolar transistors, having emitter-to-collector paths which respectively connect the first and second common current source (S1, S2) to said first terminal (U) of the second impedance (r) and said reception terminal (V, V*) of said amplifier (1), respectively.

31. The transceiver of claim 30, wherein said first common current source (S1) includes a third bipolar transistor (T3), having an emitter connected to a second potential (Vss) by way of a first resistor (N1), and a collector connected to emitters of the first bipolar transistors (T1, T1*); said third transistor (T3) having a base connected to the output of the comparator (10) of said automatic control means (2).

32. The transceiver of claim 31, wherein said second common current source (S2) includes a fourth bipolar transistor (T4), having an emitter connected to the second potential (Vss) by way of a second resistor (N2), and a collector connected to emitters of the second bipolar transistors (T2, T2*); and said fourth transistor having a base electrode (T4) polarized (Vref) in such a way as to set the value of the product RI, where R is the value of the first impedance and I is the value of the current 10 furnished by the second common current source (S2).

33. An integrated circuit, comprising a plurality of transceivers as defined by claim 3, said first automatic control means (2) being common to a plurality of said transceivers.

34. An integrated circuit, comprising a plurality of transceivers as defined by claim 4, said second automatic control means (3) being common to a plurality of said transceivers.

35. An information processing system including functional units communicating among one another, wherein some of said units include at least one integrated circuit as defined by claim 33, each transceiver of said integrated circuit being connected via a transmission link to a transceiver of the integrated circuit belonging to another functional unit of the system.

36. An information processing system including functional units communicating among one another, wherein some of said units include at least one integrated circuit as defined by claim 34, each transceiver of said integrated circuit being connected via a transmission link to a transceiver of the integrated circuit belonging to another functional unit of the system.

37. An integrated circuit, comprising a plurality of transceivers as defined by claim 29, said first automatic control means (2) being common to a plurality of said transceivers.

* * * * *

UNITED STATES PATENT AND TRADEMARK OFFICE
CERTIFICATE OF CORRECTION

PATENT NO. : 5,347,538
DATED : September 13, 1994
INVENTOR(S) : MARBOT

It is certified that error appears in the above-indentified patent and that said Letters Patent is hereby corrected as shown below:

Col. 22, line 6 (Claim 30, line 1) "claim 21" should be --claim 29--.

Col. 22, line 30 (Claim 32, line 10) "current 10 furnished" should be --current furnished--.

Signed and Sealed this

Twenty-fifth Day of April, 1995

Attest:

BRUCE LEHMAN

Attesting Officer     Commissioner of Patents and Trademarks